United States Patent [19]

Martin et al.

[11] Patent Number: 5,433,836
[45] Date of Patent: Jul. 18, 1995

[54] ARC SOURCE MACROPARTICLE FILTER

[75] Inventors: Philip J. Martin; Roger P. Netterfield; Terence J. Kinder, all of New South Wales, Australia

[73] Assignee: Commonwealth Scientific and Industrial Research Organization, Campbell, Australia

[21] Appl. No.: 122,515

[22] PCT Filed: Mar. 25, 1992

[86] PCT No.: PCT/AU92/00125
§ 371 Date: Jan. 19, 1994
§ 102(e) Date: Jan. 19, 1994

[87] PCT Pub. No.: WO92/16959
PCT Pub. Date: Oct. 1, 1992

[30] Foreign Application Priority Data

Mar. 25, 1991 [AU] Australia ............... PK 5282

[51] Int. Cl.$^6$ ............................................. C23C 14/32
[52] U.S. Cl. ....................... 204/298.41; 204/192.38; 427/540; 427/580; 250/426; 315/111.41
[58] Field of Search ................. 204/192.38, 298.41; 427/540, 580; 250/426; 315/111.41

[56] References Cited

U.S. PATENT DOCUMENTS

| | | | |
|---|---|---|---|
| 3,483,110 | 12/1969 | Rozgonyi | 204/192.12 |
| 3,899,407 | 8/1975 | Eastwood et al. | 204/192.15 |
| 4,146,810 | 3/1979 | Hicks et al. | 313/11 |
| 4,452,686 | 6/1984 | Axenov et al. | 204/298.41 |
| 4,654,231 | 3/1987 | Nyberg et al. | 427/255.3 |
| 5,078,848 | 1/1992 | Anttila et al. | 204/192.38 |
| 5,126,030 | 6/1992 | Tamagaki et al. | 204/192.38 |
| 5,279,723 | 1/1994 | Falabella et al. | 204/192.38 |
| 5,317,235 | 5/1994 | Treglio | 315/111.41 |

FOREIGN PATENT DOCUMENTS

| | | |
|---|---|---|
| 0066175 | 5/1982 | European Pat. Off. . |
| 0099725 | 7/1983 | European Pat. Off. ....... 204/298.41 |
| 0155875 | 2/1985 | European Pat. Off. . |
| 0225717 | 10/1985 | European Pat. Off. . |
| 0309733 | of 1988 | European Pat. Off. . |
| 2089110 | 6/1982 | United Kingdom . |
| WO87-02072 | 4/1987 | WIPO ............... 204/192.38 |
| WO87-05438 | 9/1987 | WIPO . |
| WO89-01699 | 2/1989 | WIPO ............... 204/192.38 |

OTHER PUBLICATIONS

"High-rate deposition of $Al_2O_3$ films using modified cathodic plasma deposition processes"; H. Randhawa; Journal of Vacuum Science & Technology; (1989), pp. 2346-2349.

"Ion Implantation: Equipment and Techniques"; Proceedings of the Fourth International Conference; Sep. 1-13, 1982, pp. 56-58 and 274-290.

EPO Patent Abstract 417-780-A; "Evaporating arc discharge cathode with cathode spots with reduced macro-particle emission"; 1991.

Japanese Kokai No. 51-111484; "Manufacture of Thin Layer of Vanadium Dioxide"; 1976.

Primary Examiner—Aaron Weisstuch
Attorney, Agent, or Firm—Leydig, Voit & Mayer

[57] ABSTRACT

An arc source macroparticle filter (1) includes a circular cathode (2) for emitting particles and an extended cylindrical anode (3) adjacent to and co-axial with the cathode for accelerating the emitted particles. Toroids (4) generate a magnetic field to define a continuous non-linear plasma duct (5) for directing charged particles and separating therefrom undesirable larger particles. The duct is minimally non-linear to permit high rates of charged particle transmission. Arc source filter (1) allows heating and/or the deposition of a variety of surface coatings to a workpiece (8).

12 Claims, 1 Drawing Sheet

ARC SOURCE MACROPARTICLE FILTER

TECHNICAL FIELD

The present invention relates to arc sources and in particular to arc source macroparticle filters which substantially remove all the macroparticles from the generated plasma.

BACKGROUND ART

The invention was developed primarily for use with electron bombardment and the deposition of metal ions and their associated oxides, and will be described hereinafter with reference to these applications. However, it will be appreciated that the invention is not limited to these particular fields of use, and is also suitable for vacuum deposition of nitrides and carbides.

Macroparticles are those particles emitted from the cathode with sizes ranging between 0.1 microns up to 10 microns. Without removal of these macroparticles from the plasma the resulting coating is found to be non-uniform and cratered. When a coating is to be applied in a high precision application such as those associated with microelectronic or optical fields, macroparticles are particularly undesirable.

The presence of macroparticles in the plasma prevents prior art arc sources from being effectively able to produce electron beams for heating of associated work pieces. When applied to this manner of operation the macroparticles would partially cover and mark the workpiece making it unsuitable for further coatings.

In conjunction with the above mentioned problem, the presence of macroparticle does not create a favourable environment for the deposition of various coatings, in particular vanadium dioxide. This coating is of considerable interest due to its transition between semiconductor and metallic properties over a small temperature range, but is difficult to produce in the exact atomic proportions required.

In the past, many macroparticle filters have included the use of 90° bending of the plasma by magnetic fields so that the much larger macroparticles would separate from the plasma. However, an extended magnetic field is needed to produce the required bending and confining of the plasma. These prior art devices only accommodate positive ion currents of less than 200 mA for 100 A arcs, and thereby have a very restricted deposition rate and film growth rate.

DISCLOSURE OF THE INVENTION

It is an object of the present invention to provide an arc source macroparticle filter which overcomes or substantially ameliorates at least some of the disadvantages of the prior art.

According to one aspect of the invention there is provided an arc source macroparticle filter comprising a cathode for emitting particles, an extended tubular anode adjacent and substantially coaxial with the cathode for accelerating the emitted particles, and means for generating a magnetic field to define a continuous non-linear plasma duct to direct preselected charged particles and separate therefrom undesirable larger particles, the duct being minimally non-linear to permit high rates of charged particle transmission.

Preferably, the temperature of the anode is maintained within a predetermined range to facilitate removal of the undesirable particles from the plasma.

Preferably also, the length of the extended anode is at least six times the diameter of the cathode to facilitate removal of the undesirable particles from the plasma.

In a preferred form the non-linear plasma would form a smooth curve, traversing an angle of substantially 45° to facilitate removal of the undesirable particles from the plasma while allowing high charge transfer rates.

According to another aspect of the invention there is provided a method of producing vanadium dioxide including the steps of:

heating a workpiece by means of electron bombardment which is substantially macroparticle free; and bombarding of said workpiece with positive vanadium ions in the presence of an oxygen atmosphere while maintaining a lower level of said electron bombardment.

Preferably, the vanadium dioxide is produced using an arc source macroparticle filter as described above, wherein vanadium dioxide coatings are applied to workpieces.

Preferably also, the arc source macroparticle filter is provided with low voltage positive biasing of the workpiece for enabling simultaneous bombardment of the workpiece with both electrons and vanadium ions.

A preferred embodiment of the invention will now be described, by way of example only, with reference to the accompanying drawing in which:

MODES FOR CARRYING OUT THE INVENTION

Figure 1:
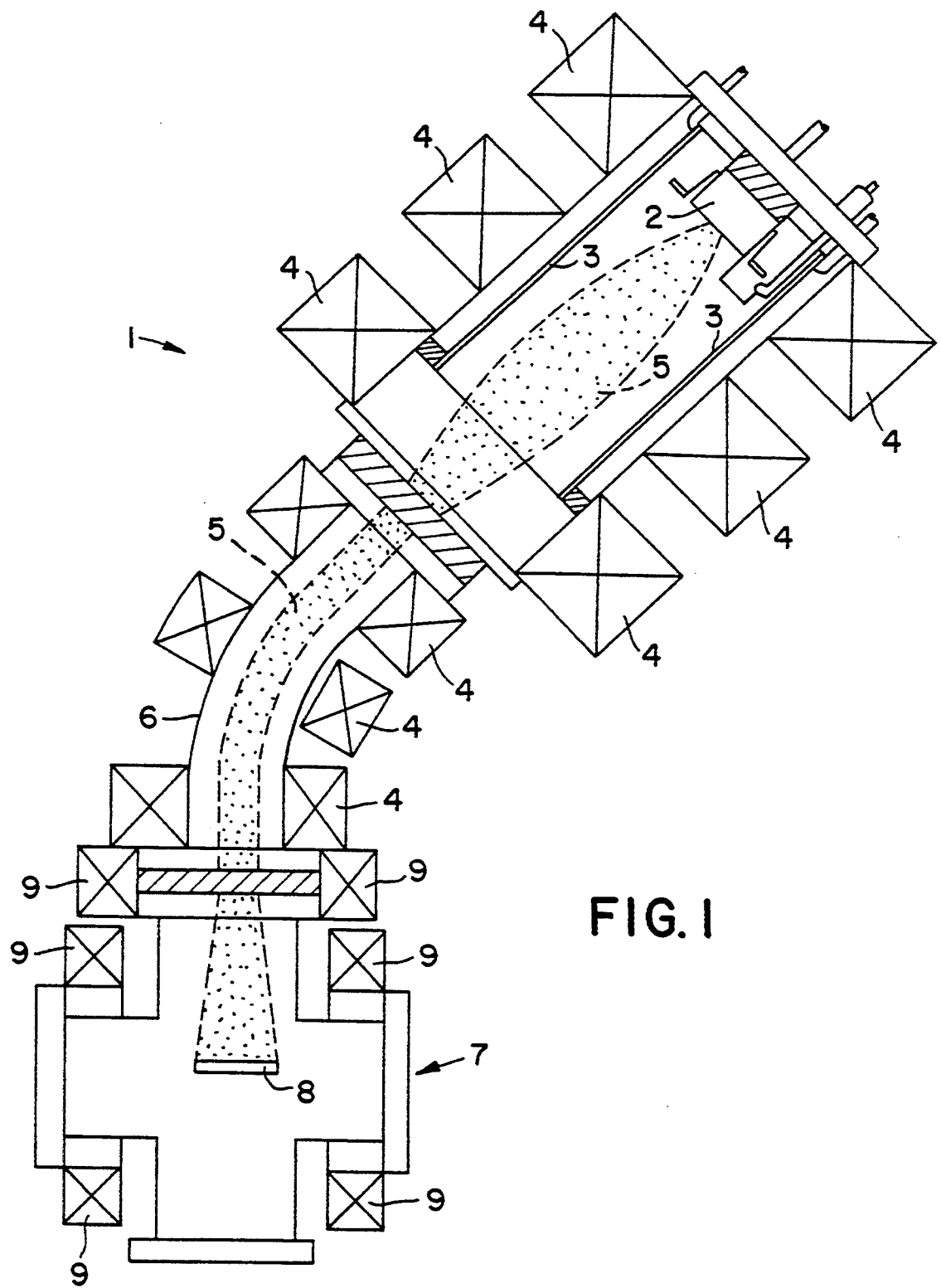
FIG. 1 is a cut-away top view of an arc source macroparticle filter according to the invention.

Referring to the drawing, the arc source macroparticle filter 1 comprises a circular cathode 2 for emitting particles, an extended cylindrical anode 3 adjacent and coaxial with the cathode for accelerating the emitted particles, and toroids 4 for generating a magnetic field. The toroidal field is such so as to define a continuous non-linear plasma duct 5, for directing preselected charged particles and separating undesirable larger particles. The duct is minimally non-linear to permit high rates of charged particle transmission.

The length of the anode 3 is six times the diameter of the cathode 2, and has its temperature maintained at substantially 10° C. by chilled water flowing in a helically wound tube (not shown) surrounding the anode. These two factors facilitate the removal of a large proportion of the macroparticles.

The duct 5 traverses an angle of less than 90°. More preferably, the duct 5 traverses an angle of less than 60°. Most preferably, the duct 5 traverses an angle of about 45°, which is sufficient to provide substantially minimal non-linearity for the plasma. The macroparticles, whose motion is relatively unaffected by the generated magnetic field, will diverge from the plasma.

The accelerated particles are substantially maintained within an area approximately equal to the cathode area, (which is circular, with a diameter of 58 mm). The shape of the plasma (gaussian) requires that a tube 6 of somewhat greater diameter than the cathode be used for providing outer limits to the plasma. In this embodiment the tube diameter is 100 mm. This also suggests that a larger diameter cathode would not permit higher rates of transmission, as a larger proportion of the plasma would simply collide with the tube.

A further advantage which the minimally non-linear 45° duct confers is that much higher rates of charge particle transmission can be achieved due to less dispersion of the plasma. Charge transfer rates of up to 2.5 amps are possible, which are substantially macroparticle free.

Also included in the preferred embodiment of the arc source macroparticle filter is a target area 7 for placing a workpiece 8 which is required to be subject to the generated plasma. The target area includes magnetic scanning coils 9 for focusing and precisely locating the plasma within the target area.

The arc source is able to be biased by applying an appropriate voltage to anode 3 to give the emitted particles greater energy. In the case of positive ions this has the effect of producing denser films, wherein for an electron beam the result is the electrons cause more rapid heating.

The absence of macroparticles enables the arc source macroparticle filter to function as a high intensity electron source for heating of work pieces prior to coating. Additionally, this high electron density source is able to be used for excitation and ionisation of vapour produced by an auxiliary evaporation source. When operating in such a mode, high intensity low energy electron beams are capable of being produced. That is, currents of the order of 10 amps and energies of the order of 5 eV. This heating capability may be exploited as a means for vacuum degassing components, surface annealing or other vacuum heat treatments.

The deposition of high quality coatings can be carried out because of the absence of macroparticles. Metals such as titanium, aluminium, vanadium, copper, stainless steel, zirconium and tantalum can all be successfully deposited. Superconducting materials such as Nb can also be deposited.

The absence of macroparticles has been tested by such methods as electron microscopy and talysurf, the latter being an rms measure of surface roughness in Angstroms. Both methods revealed an improved and smoother coating, entirely macroparticle free.

Introducing an oxygen or nitrogen atmosphere enables the deposition of oxides or nitrides of the above metals. The deposition of diamond-like or amorphous tetrahedrally co-ordinated carbon also described as amorphous diamond, and many alloys and steels is also possible.

An example of the use of such coatings can be illustrated by the depositions of titanium nitride on a twist drill. A coating of five microns can be applied for providing both a harder surface and a lower coefficient of friction than is obtained from the original steel. This has the effect of increasing tool life.

A method of producing vanadium dioxide utilises the embodiment as described above. Due to the absence of substantially all macroparticles a "clean" environment is established allowing the formation of this otherwise hard-to-produce compound. The workpiece is positively biased at 200 volts with respect to the chamber ground, and the resulting high density electron beam is used to heat the workpiece to a temperature between 500° C. and 600° C. Under these circumstances positive ions are repelled from the target.

Upon reaching a suitable temperature a negative bias of the order of 30 volts is applied so that positive vanadium ions may contact the target in the presence of the oxygen atmosphere. This bias results in a reduced electron beam for further heating of the workpiece as the film is deposited.

Vanadium dioxide films produced using this method can be deposited at a thickness of about 0.5 to 1 microns. Measurements of temperature dependent resistivity and visibly observable optical changes have confirmed the films to be substantially pure vanadium dioxide.

The invention provides an improved relatively simple arc source macroparticle filter which can provide a wide range of charged particle beams for a wide range of applications. Furthermore, the reduction in the angle required to bend the beam allows greater rates of particle transmission.

Although the invention has been described with reference to specific examples, it will be appreciated by those skilled in the art that the invention may be embodied in many other forms.

We claim:

1. An arc source macroparticle filter comprising a cathode for emitting particles, an extended tubular anode adjacent and substantially coaxial with said cathode for accelerating said emitted particles, and means for generating a magnetic field to define a continuous non-linear plasma duct to direct preselected charged particles and separate therefrom undesirable larger particles, wherein said duct is minimally non-linear to permit high rates of charged particle transmission and the length of said anode is at least six times the diameter of said cathode.

2. An arc source filter according to claim 1 further comprising means for maintaining the temperature of said anode below a predetermined temperature.

3. An arc source filter according to claim 2 wherein said predetermined temperature is 20° C.

4. An arc source filter according to claim 1 wherein the non-linear plasma duct traverses an angle of less than 90°.

5. An arc source filter according to claim 4 wherein the non-linear plasma duct traverses an angle of less than 60°.

6. An arc source filter according to claim 5 wherein the non-linear plasma duct forms a smooth curve traversing an angle of substantially 45°.

7. An arc source filter according to claim 1 further comprising means for directing said preselected charged particles towards a workpiece.

8. An arc source filter according to claim 7 further comprising means for electrically biasing said workpiece.

9. An arc source filter according to claim 8 which includes focusing means for generating a magnetic field to further direct said preselected charged particles toward a particular location on the workpiece.

10. An arc source macroparticle filter comprising a cathode for emitting particles, an extended tubular anode adjacent and substantially co-axial with said cathode for accelerating the emitted particles, means for generating a magnetic field to form the emitted particles into a continuous non-linear plasma duct and to direct preselected charged particles and separate therefrom undesirable larger particles, the duct being minimally non-linear to permit high rates of charge particle transmission, and means for maintaining the temperature of the anode below a predetermined temperature.

11. An arc source macroparticle filter according to claim 10 wherein the predetermined temperature is 20° C.

12. An arc source macroparticle filter according to claim 10 wherein the length of the anode is at least six times the diameter of the cathode.

* * * * *